(12) United States Patent
Sciarretta et al.

(10) Patent No.: US 8,487,628 B2
(45) Date of Patent: Jul. 16, 2013

(54) SYSTEM FOR SMART MANAGEMENT OF AN ELECTROCHEMICAL BATTERY

(75) Inventors: Antonio Sciarretta, Rueil Malmasion (FR); Valérie Sauvant-Moynot, Lyons (FR)

(73) Assignee: IFP Energies Nouvelles, Cedex (FR)

(*) Notice: Subject to any disclaimer, the term of this patent is extended or adjusted under 35 U.S.C. 154(b) by 416 days.

(21) Appl. No.: 12/919,721

(22) PCT Filed: Mar. 27, 2009

(86) PCT No.: PCT/FR2009/000339
§ 371 (c)(1),
(2), (4) Date: Nov. 24, 2010

(87) PCT Pub. No.: WO2009/133262
PCT Pub. Date: Nov. 5, 2009

(65) Prior Publication Data
US 2011/0060565 A1 Mar. 10, 2011

(30) Foreign Application Priority Data
Mar. 28, 2008 (FR) ..................... 08 01709

(51) Int. Cl.
*G01R 31/36* (2006.01)
(52) U.S. Cl.
USPC ........................................ 324/426

(58) Field of Classification Search
USPC ............... 324/426, 430; 702/63; 320/132, 320/104, 134, 137
See application file for complete search history.

(56) References Cited

U.S. PATENT DOCUMENTS

| 6,037,777 | A | 3/2000 | Champlin |
| 6,191,590 | B1 | 2/2001 | Klütz et al. |
| 6,778,913 | B2 | 8/2004 | Tinnemeyer |
| 7,202,632 | B2 * | 4/2007 | Namba ...................... 320/132 |
| 7,847,557 | B2 * | 12/2010 | Yun et al. ...................... 324/430 |
| 2002/0120906 | A1 | 8/2002 | Xia et al. |
| 2007/0035307 | A1 | 2/2007 | Schoch |
| 2007/0090843 | A1 | 4/2007 | Doncker et al. |

FOREIGN PATENT DOCUMENTS

| EP | 0 880 710 B1 | 8/2004 |
| EP | 1 835 297 A1 | 9/2007 |
| WO | WO 2008/026525 A1 | 3/2008 |

* cited by examiner

*Primary Examiner* — Tung X Nguyen
(74) *Attorney, Agent, or Firm* — Antonelli, Terry, Stout & Kraus, LLP.

(57) ABSTRACT

The present invention relates to a system for smart management of an electrochemical battery using a method of estimating the internal state of the battery, by use of mathematical models for management of an electrochemical battery during operation thereof, and notably for estimating the characteristics of the battery that are not directly measurable. For applications relative to hybrid and electric vehicles, the most interesting internal characteristics are the state of charge (SoC), the state of health (SoH) and the thermal state. Reconstruction of the internal characteristics is done using mathematical models of the batter.

20 Claims, 8 Drawing Sheets

SYSTEM FOR SMART MANAGEMENT OF AN ELECTROCHEMICAL BATTERY

CROSS-REFERENCE TO RELATED APPLICATIONS

Reference is made to U.S. patent application Ser. No. 12/919,731 entitled "Method of Estimating the Non-Measurable Characteristics of an Electrochemical System," filed on Nov. 24, 2010, and to U.S. patent application Ser. No. 12/869,547 entitled "Improved Method of Estimating the Non-Measurable Characteristics of an Electrochemical System," also filed on Aug. 26, 2010, which applications are incorporated herein by reference in their entirety.

BACKGROUND OF THE INVENTION

1. Field of the Invention

The present invention relates to a method for estimating the characteristics of an electrochemical battery that are not directly measurable. The method allows management of an electrochemical battery, notably during its operation in a hybrid or electric vehicle.

2. Description of the Background Art

The electrochemical battery is one of the most critical components of a hybrid or electric vehicle. Smooth operation of the vehicle is based on a smart battery management system (BMS) whose purpose is to operate the battery with the best compromise between the various dynamic load levels. Precise and reliable knowledge of the state of charge (SoC), the state of health (SoH) and the thermal state (T) is essential for the BMS.

The SoC of a battery is the available capacity thereof (expressed as a percentage of its nominal capacity). Knowing the SoC allows estimation of how long the battery can continue to supply energy at a given current or how long it can absorb energy. This information conditions the operation of the entire vehicle and notably the management of the energy among its components.

During the life of a battery, battery performance degrades gradually due to the physical and chemical variations that occur during use, until the battery becomes unusable. The state of health (SoH), which is the available capacity after recharging (expressed in Ah), thus is a measurement of the point that has been reached in the life cycle of the battery.

The thermal state (T) of a battery conditions its performances because the chemical reactions and transport phenomena involved in the electrochemical systems are thermally activated. The initial thermal state is linked with the temperature external to the vehicle, which can be operated within a wide temperature range, typically between −40° C. and +40° C. The thermal state during operation evolves depending on the battery draw under charge and discharge conditions, its design and its environment.

More precise and reliable estimation of the SoC, the SoH and the thermal state T thereof consequently involves several advantages. This estimation prevents the vehicle supervisor from operating too conservatively regarding the use of the energy potential of the battery or inversely. It also allows avoiding safety oversizing of the battery and therefore to save on-board weight and, consequently, consumed fuel and reduction of the total cost of the vehicle. A correct estimator thus guarantees efficient and reliable use of the battery capacity over the entire operating range of the vehicle.

The SoC estimation method referred to as "Coulomb counting" or "book keeping" is known in the field of the invention, but causes estimation errors by disregarding phenomena such as self-discharge.

The SoC indicator is a known no-load voltage measurement method. Other indicators are disclosed for the estimation of internal resistance in U.S. Pat. No. 6,191,590 and EP Patent 1,835,297.

With the latter two methods, the SoC is first associated with one or more measurable or easily assessable quantities, through static mappings or analytical functional dependencies. However, these dependencies are in fact much more complicated than what is normally taken into account in the BMS, which often leads to SoC estimation errors.

A potentially more promising method is based on the measurement, by impedance spectroscopy (EIS), of a physical quantity parametrized by the SoC. For example, U.S. Published Patent Application 2007/0090843 suggests determining by EIS the frequency $f\pm$ associated with the capacitive/inductive transition. A correlation between frequency $f\pm$ and the SoC is presented for a lead battery, for Ni—Cd batteries and Ni-MH batteries.

A similar approach is based on modelling the EIS spectra by equivalent electric circuits whose components are parametrized by the SoC, as described in U.S. Pat. No. 6,778,913 filed by the Cadex Electronics Company, regarding the automotive battery tester Spectro CA-12 based on the multi-frequency electrochemical impedance spectroscopy for the acid-lead pair. The EIS spectra are approximated by equivalent electric circuits and the evolution of the components is parametrized by the SoC. Similarly, U.S. Pat. No. 6,037,777, filed by K. S. Champlin, determines the state of charge and other battery properties by measuring the real and imaginary parts of the complex impedance/admittance for lead batteries or other systems.

An alternative approach is based on mathematical battery models providing estimation techniques known in other fields. U.S. Published Patent Application 2007/0035307 notably describes a method for estimating the variables of state and the parameters of a battery from operating data (voltage U, current I, T), using a mathematical battery model. The mathematical model comprises a plurality of mathematical submodels which allow faster response. The submodels are models of equivalent electrical circuit type, referred to as RC models, associated with restricted frequency ranges.

The use of RC models is also described in EP Patent 880, 710 (Philips). The description of the electrochemical and physical phenomena at the electrodes and in the electrolyte serves as a support for the development of the RC model with the temperature of the battery being simulated by the model in order to gain precision for an external measurement.

In the models of RC type, the SoC is always introduced only to parametrize other variables. The SoC itself is never mentioned as an electrochemical variable.

Another SoC estimation method known in the literature ([Gu, White, etc.]) is based on the mathematical description of the reactions of an electrochemical system. The SoC is calculated from variables of state of the system. This description is based on charge, energy, material balances, and on semi-empirical correlations.

SUMMARY OF THE INVENTION

The present invention relates to the use of a method for estimating the internal state of a rechargeable electrochemical system (such as a battery), which notably estimates the characteristics of the system that are not directly measurable (reference model). The method uses measurements readily and conventionally obtained to reconstruct the internal state of the battery by a mathematical model of the battery, which can be advantageously used synchronously with the operation of the battery itself (real time). In particular, the method allows estimation of the SoC, the SoH and the thermal state T of an electrochemical battery, which are the most interesting internal characteristics for applications relative to hybrid and electric vehicles.

The method can comprise derivation of a reduced model from the reference model to allow simplified use, notably for on-board control and energy management of a hybrid vehicle.

The invention relates to a smart system for energy and thermal management of the battery during operation.

The invention also is a battery charger/discharger using the method of the invention.

The method can also be used in a simulator of the thermal state of an electrochemical system belonging to the management system.

The invention also relates to the use of a method for estimating the internal state of a rechargeable electrochemical system (such as a battery) comprising:
  measuring at least one input signal of at least one parameter representative of a physical quantity of the rechargeable electrochemical system;
  establishing a reference model of the system including at least:
    a mathematical representation of kinetics of the electrochemical reactions that take place at interfaces between the electrodes and the electrolyte, by accounting for the interface concentrations,
    an electric representation of spatial accumulation of charges at the electrodes,
    a balance of the charges in the solid phases (the electrodes) and in the liquid phase (electrolyte),
    a material balance in all phases of the system, and
    an energy balance of the system for calculating the temperature of the battery; and
  generating at least one output signal derived from calculation of the temperature.

Advantageously, the interface concentration and the local concentration $C=f(x,t)$ are distinguished for each active species in the electrochemical system.

Advantageously, the potential and/or the state of charge and/or the temperature of the electrochemical system is recorded as an output signal.

In an embodiment, the reference model is used to derive a reduced model of the system by replacing the local concentration by a mean concentration $c=f(t)$ for each active species in the electrochemical system.

Advantageously, in the method using the reduced model, the state of health of the electrochemical system is recorded as an output signal.

The invention relates to a system for smart management of an electrochemical battery comprising:
  an input means, connected to a measuring means of the battery, for receiving an input value of at least one parameter measured by the measuring means which is representative of a physical quantity of the battery;
  a processing means, including at least one processor, for generating at least one output signal of at least one characteristic calculated by the reduced model; and
  an information/control means providing information on the physical quantity of the battery and/or controlling charge/discharge and/or cooling of the battery in response to the output signal of the processing means.

Preferably, the processing means comprises a recursive filter.

The management system can be used for on-board control and energy management of a hybrid vehicle.

The invention also relates to a battery charger/discharger comprising the management system.

The invention also relates to a simulator of the thermal state of a battery using the method which is part of the smart management system.

BRIEF DESCRIPTION OF THE DRAWINGS

FIGS. 1 to 8 illustrate the invention by way of non limitative example and they relate to a Ni-MH battery, although the model according to the invention can be applied to any electrochemical system.

DETAILED DESCRIPTION OF THE INVENTION

Figure 1:
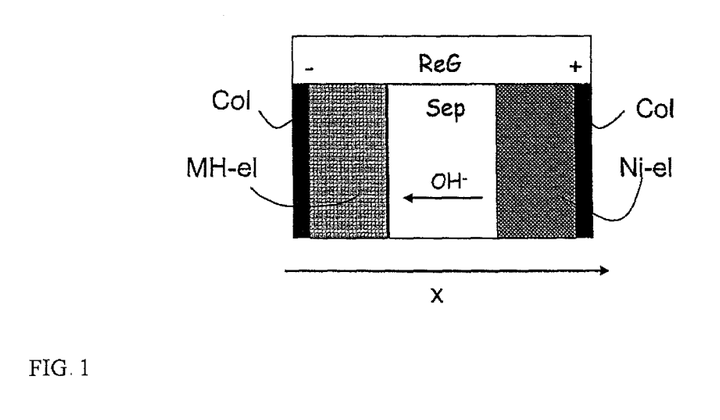
FIG. 1 shows a Ni-MH battery cell.

FIG. 1 diagrammatically shows a Ni-MH battery cell, where MH-el designates the metal hydride-based porous negative electrode, Ni-el the nickel-based porous positive electrode, ReG the gas reserve compartment, Sep the separator insulating electrically the two electrodes, Col the current collectors and x the prevalent direction. In order to guarantee ionic conduction between the two electrodes when there is a current flow, the electrodes and the separator are impregnated with a concentrated alkaline solution. The gas (oxygen) that can be released during charging of the battery is concentrated in a common space above the cells.

Figure 2:
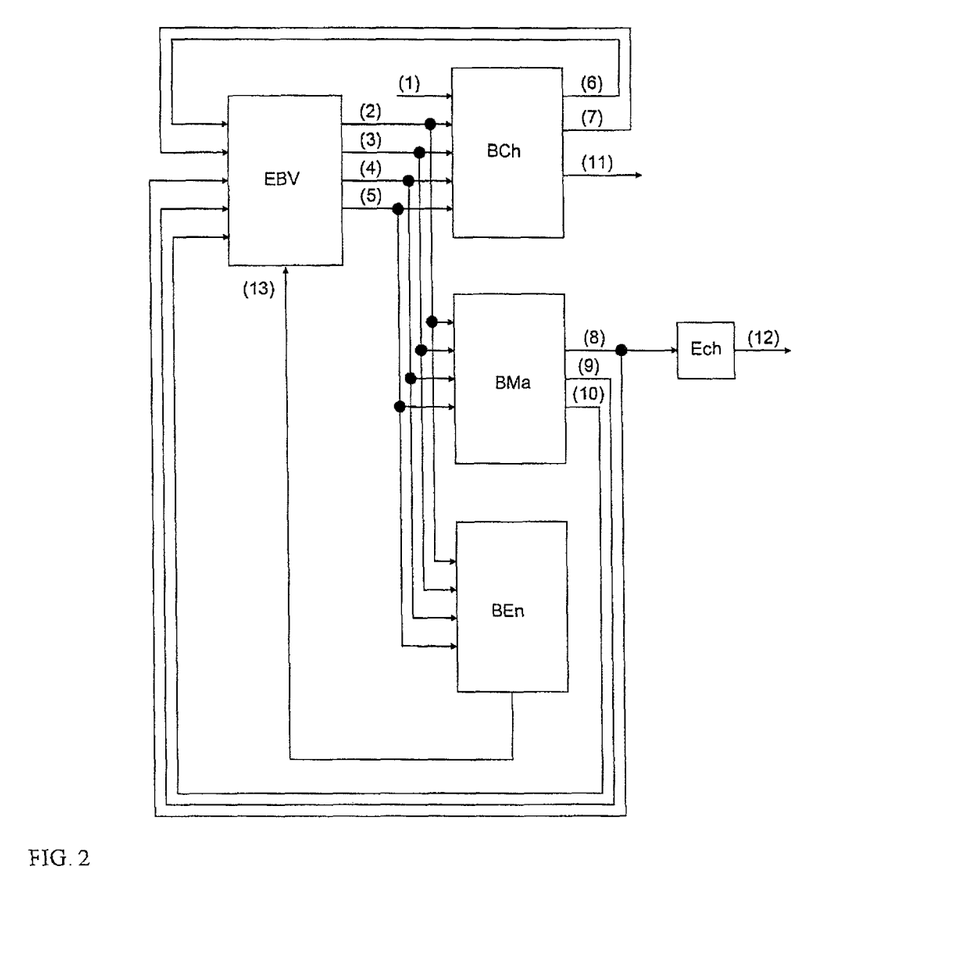
FIG. 2 shows a flowsheet of the model that is used in the method of the invention.

FIG. 2 represents a flowsheet of the model that is used in the method of the invention, where the abbreviations have the following meaning:
  EBV: Butler-Volmer equations, Equ. (4)-(8) (electrochemical reactions kinetics);
  (1): I,
  (2): $J_1$,
  (3): $J_2$,
  (4): $J_3$,
  (5): $J_4$;
  BCh: charge balance;
  (6): $\Delta\phi_{pos}$;
  (7): $\Delta\phi_{neg}$;
  BMa: material balance;
  (8): $c_n$,
  (9): $c_m$,
  (10): $p_o$;

(11): V,
(12): q;
Ech: state of charge;
BEn: energy balance,
(13): T.

The current at the cell terminals is considered as an input of the model, whereas the voltage is one of its outputs. The input signals, current and temperature, are representative of physical quantities measured on the battery. A processing means including processors EBV, BCh, BMa and BEn, which respectively calculate the Butler-Volmer equations, to produce outputs (1)-(5), charge balance to produce outputs (6) and (7), material balance to produce outputs (8)-(10) and the temperature output T (13) to calculate the state of the battery on the basis of the input signals. The processors generate output signals derived from the calculation, such as the potential, the SoC and the temperature T.

Figure 3:
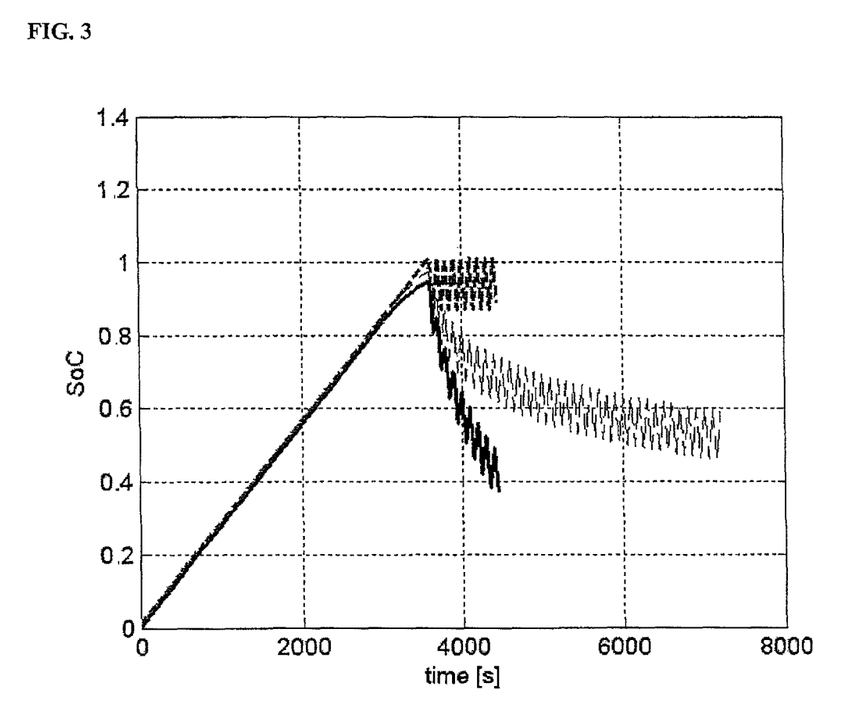
FIG. 3 shows an example of associated SoC estimation curves.

FIG. 3 shows an example of associated SoC estimation curves obtained by integration of the current which is the thick dotted line and by use of the models according to the invention, the reduced model which is the thin dotted line and the reference model which is the thick full line.

Figure 4:
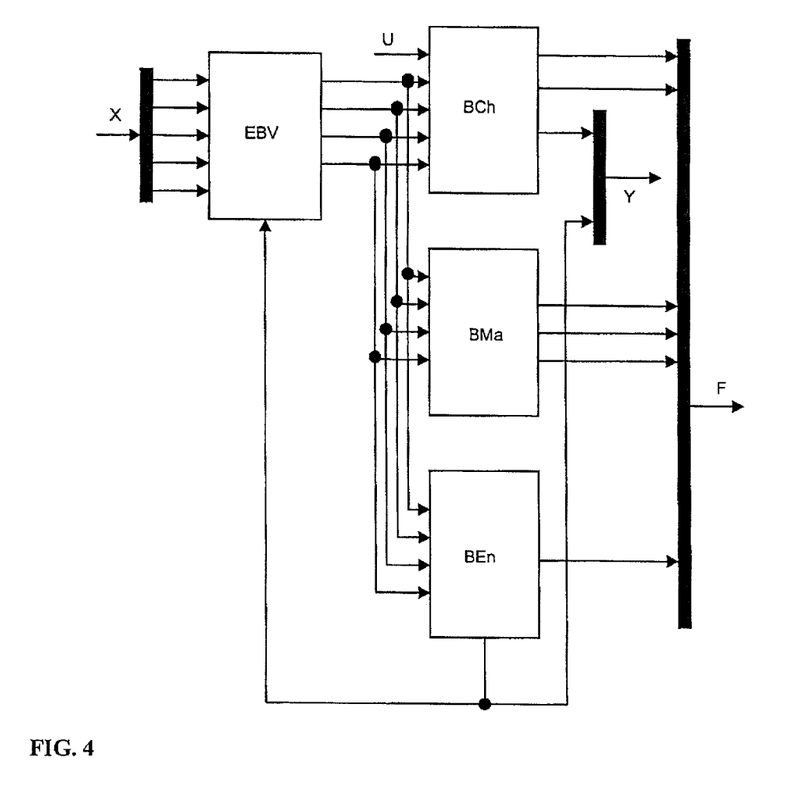
FIG. 4 shows a Kalman filter that is applied to an electrochemical cell according to the method of the invention.

FIG. 4 shows a Kalman filter that is applied to an electrochemical cell according to the method of the invention, with X being the internal state calculated by the estimator, U being the input, Y being the output and F being variation of the internal state according to the model.

Figure 5:
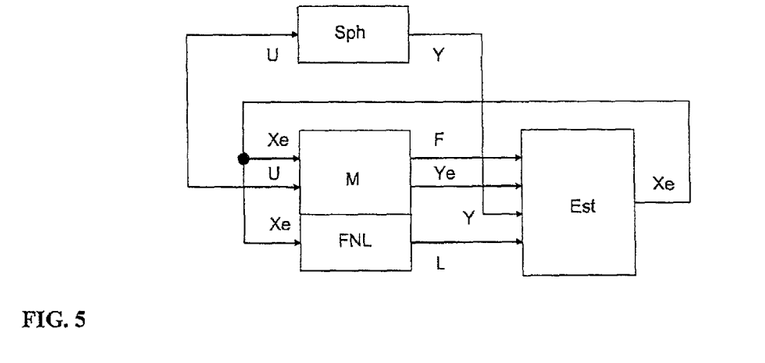
FIG. 5 is a flowsheet of a hybrid vehicle simulator using the method of estimating the internal characteristics according to the invention.

FIG. 5 is a flowsheet of an SoC estimation algorithm, with Sph being the physical system, M being the model, FNL being a non-linear filter, Est being the estimator, U being the measured inputs, Y being measured outputs, Ye being outputs calculated by the model, Xe being the internal state calculated by the estimator, F being variation of the internal state according to the model, and L being the gain at the non-linear filter output.

Figure 6:
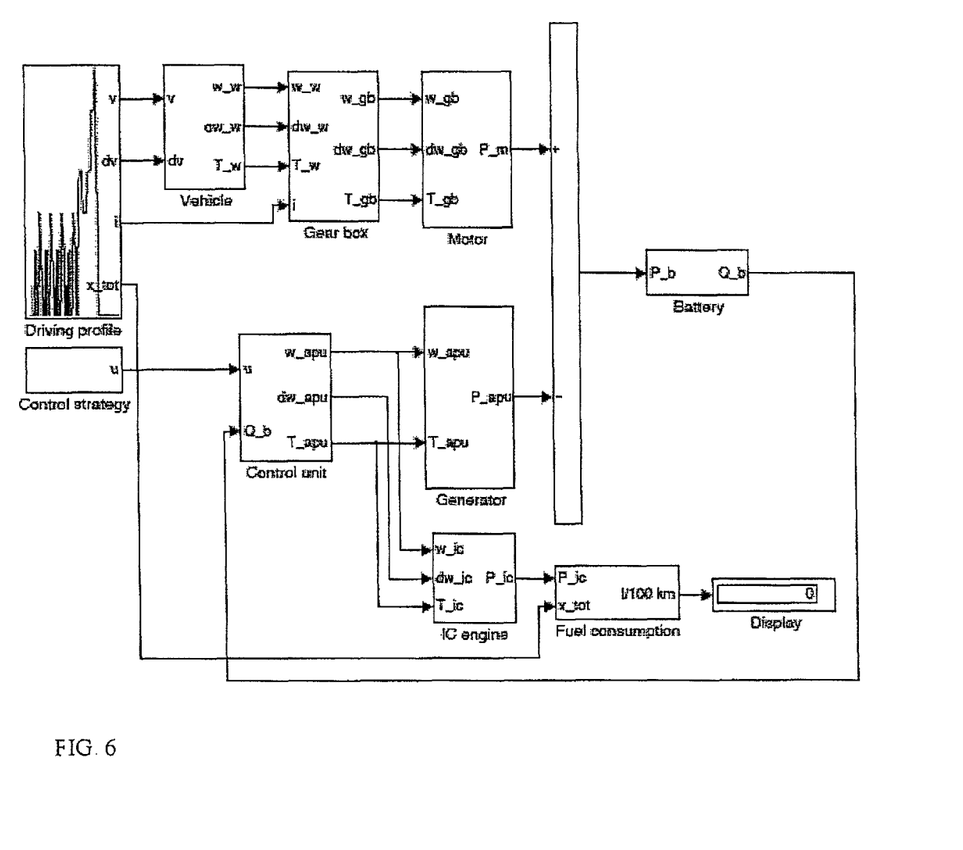
FIG. 6 is a flowsheet of a hybrid vehicle simulator using the method of estimating the internal characteristics according to the invention.

FIG. 6 is a flowsheet of a hybrid vehicle simulator using the method of estimating the internal characteristics according to the invention.

Figure 7A:
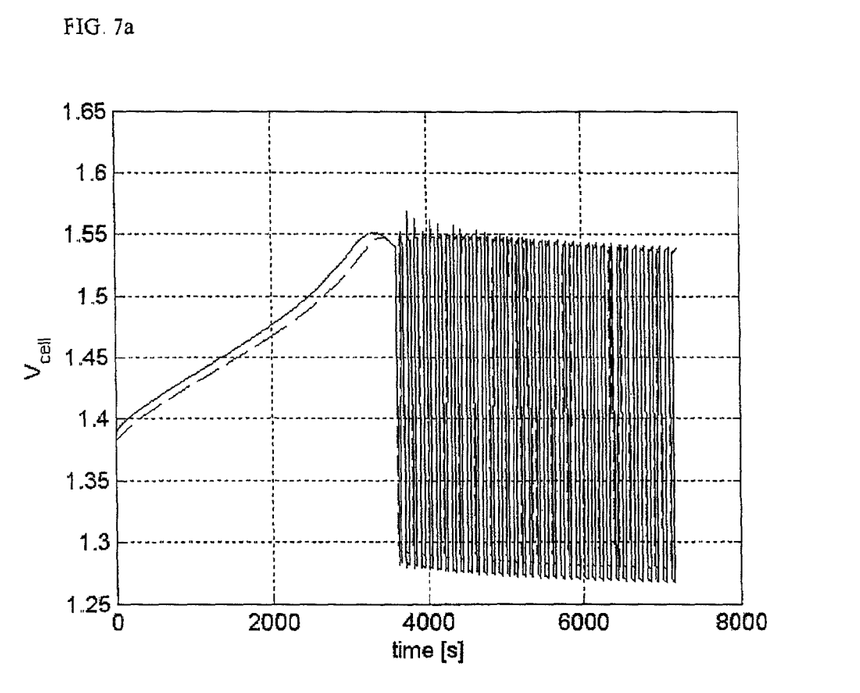
FIGS. 7a and 7b show examples of charge/discharge curves.
Figure 7B:
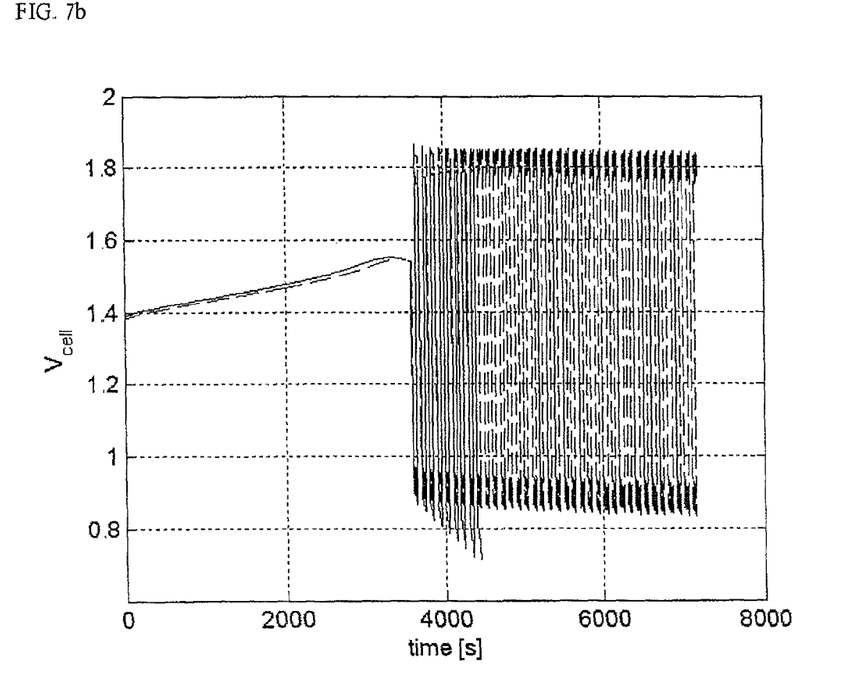

FIGS. 7a and 7b show an example of charge/discharge curves with various current modes and at ambient temperature; a) charge 1C, strobe 1C; b) charge 1C, strobe 10C.

The dotted line curve is the reduced model according to the invention and the full line curve is the reference model according to the invention.

Figure 8:
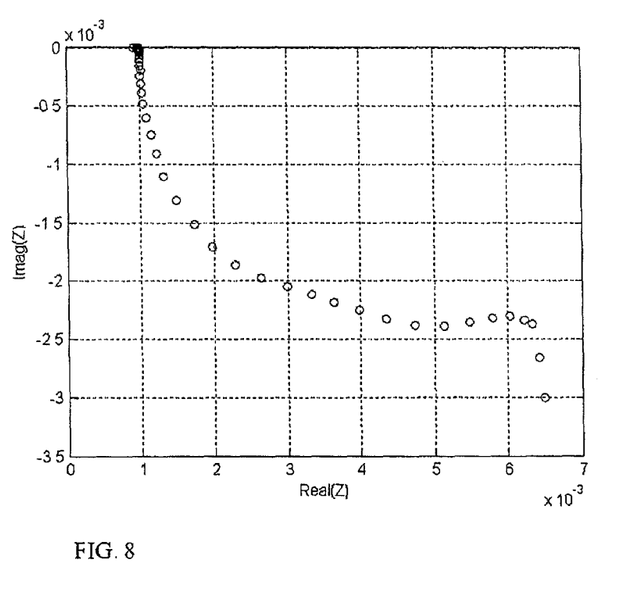
FIG. 8 shows an example of an electrochemical impedance spectroscopy curve simulated from the method of the invention.

FIG. 8 shows an example of an electrochemical impedance spectroscopy curve simulated from the method of the invention, representing the imaginary part of the impedance Imag (Z) as a function of the real part of the impedance Real(Z).

Development of a Reference Model

Mathematical Description of the Electrochemical Kinetics

Electrochemical reactions take place at the interfaces between the electrodes and the electrolyte. The positive electrode is the location of the electrochemical reactions where reduction of the oxidizing species occurs, during discharge, whereas the negative electrode is the location of reactions of oxidation of the reducing species. The kinetics of the electrochemical reactions can be described by Butler-Volmer's equations, whose general form for the generic reaction "z" is:

$$J_z = J_{0,z}\{\exp[\alpha_{a,z}K(\Delta\Phi_z - U_{eq,z})] - \exp[-\alpha_{c,z}K(\Delta\Phi_z - U_{eq,z})]\} \cdot \cdot \exp\left(\frac{E_{a,z}}{R}\left(\frac{1}{T} - \frac{1}{T_0}\right)\right) \quad (1)$$

wherein $J_z$ is the charge transfer current density, $J_{z0}$ is the exchange current density, $\Delta\Phi_z$ is the potential difference between the solid phase (electrode) and the electrolyte, $U_{eq,z}$ is the reaction equilibrium potential, $\alpha_z$, is a symmetry factor (different for the positive electrode, subscript "c", and the negative electrode, subscript "a"), whereas K is a function of temperature T (K=F/RT), and $E_{a,z}$ is the activation energy.

In the case of an Ni-MH battery, the active species are nickel oxyhydroxide NiOOH, nickel hydroxide $Ni(OH)_2$, metal hydride MH, oxygen $O_2$ partly dissolved in the electrolyte at equilibrium with the gas phase. The electrochemical reactions at the positive electrode are, during discharge:

$$NiOOH + H_2O + e^- = Ni(OH)_2 + OH^-$$

$$0.5O_2 + H_2O + e^- = 2OH^- \quad (2)$$

whereas, at the negative electrode:

$$MH + OH^- = H_2O + e^- + M$$

$$2OH^- = 0.5O_2 + H_2O + 2e^- \quad (3)$$

By applying Equation (1) to the four reactions (2)-(3), with z=1, . . . 4, the following is obtained:

$$J_1(t) = J_{1,0} \cdot \left\{ \left(\frac{c_n(t)}{c_{n,ref}}\right) \cdot \left(\frac{c_e}{c_{e,ref}}\right) \cdot e^{0.5 \cdot K \cdot \eta_1(t)} - \left(\frac{c_{n,max} - c_n(t)}{c_{n,max} - c_{n,ref}}\right) \cdot e^{-0.5 \cdot K \cdot \eta_1(t)} \right\} \cdot \exp\left(\frac{E_{a,1}}{R}\left(\frac{1}{T} - \frac{1}{T_0}\right)\right) \quad (4)$$

$$J_2(t) = J_{2,0} \cdot \left\{ \left(\frac{c_e}{c_{e,ref}}\right)^2 \cdot e^{1.5 \cdot K \cdot \eta_2(t)} - \left(\frac{\overline{c}_o(t)}{c_{o,ref}}\right)^{1/2} \cdot e^{-0.5 \cdot K \cdot \eta_2(t)} \right\} \cdot \cdot \exp\left(\frac{E_{a,2}}{R}\left(\frac{1}{T} - \frac{1}{T_0}\right)\right), \quad (5)$$

$$J_3(t) = J_{3,0} \cdot \left\{ \left(\frac{c_m(t)}{c_{m,ref}}\right)^\mu \cdot \left(\frac{c_e}{c_{e,ref}}\right) \cdot e^{0.5 \cdot K \cdot \eta_3(t)} - e^{-0.5 \cdot K \cdot \eta_3(t)} \right\} \cdot \exp\left(\frac{E_{a,3}}{R}\left(\frac{1}{T} - \frac{1}{T_0}\right)\right), \quad (6)$$

$$J_4(t) = J_{4,0} \cdot \left\{ \left(\frac{c_e}{c_{e,ref}}\right)^2 \cdot e^{1.5 \cdot K \cdot \eta_4(t)} - \left(\frac{c_o(t)}{c_{o,ref}}\right)^{1/2} \cdot e^{-0.5 \cdot K \cdot \eta_4(t)} \right\} \cdot \cdot \exp\left(\frac{E_{a,4}}{R}\left(\frac{1}{T} - \frac{1}{T_0}\right)\right), \quad (7)$$

wherein $c_n$ is the concentration of the protons in the positive electrode (nickel hydroxide), $c_e$ is the concentration of the electrolyte, that is of the $OH^-$ ions, $c_o$ is the concentration of oxygen in the negative electrode and the $\overline{c}_o$ variable is the interfacial oxygen concentration, at equilibrium with the gas phase, $c_m$ is the concentration of hydrogen in the negative electrode (metallic material), whereas subscripts "ref" and "max" relate to the reference and maximum values respectively; and finally, $\mu$ represents the reaction order.

Superpotentials $\eta_z$ are defined as:

$$\eta_1(t) = \Delta\phi_{pos}(t) - U_{eq,ref,1}(t)$$

$$\eta_2(t) = \Delta\phi_{pos}(t) - U_{eq,ref,2}(t)$$

$$\eta_3(t) = \Delta\phi_{neg}(t) - U_{eq,ref,3}(t)$$

$$\eta_4(t) = \Delta\phi_{neg}(t) - U_{eq,ref,4}(t) \quad (8)$$

where $\Delta\phi_{pos}$ and $\Delta\phi_{neg}$ are the solid-liquid potential differences at the positive and negative electrode respectively.

Expressions for $U_{eq,ref,1}$, $U_{eq,ref,2}$, $U_{eq,ref,3}$ and $U_{eq,ref,4}$ as a function of temperature are known. For example, it is known:

$$U_{eq,ref,1} = \frac{k_1}{K(T)}(2\theta - 1) + U_1^0 + (T - T_0)\frac{dU_1}{dT} \quad (8a)$$

where $\theta$ is the SoC, $k_1$ a constant and $U_1$ is characterized by its derivative with respect to temperature T. Similarly, the parameterizations are known:

$$U_{eq,ref,z} = U_z^0 + (T - T_0)\frac{dU_z}{dT} \quad (8b)$$

for z=2, ..., 4.

Charge Balance

According to FIG. 2, kinetic equations (4)-(7) are coupled with the equations that describe the mass and charge balances in the solid and liquid phases. In the liquid phase (electrolyte), the mass conservation of species "i" is written as follows:

$$\epsilon_{(k)}\frac{\partial c_i(t)}{\partial t} = -\nabla N_i(t) + R_i(t) \quad (9)$$

where $c_i$ is the concentration, the material flow density, $R_i$ the material conversion ratio, whereas $\epsilon_{(k)}$ is the porosity of region "k" of the cell (k=1 for the positive electrode, k=2 for the separator, k=3 for the negative electrode). The material flow is conventionally separated into three contributions, migration, diffusion and convection, for which correlations conventionally exist. Convection is often disregarded and the material flow is thus written:

$$N_i(t) = -\epsilon_{(k)}^{\gamma(k)} D_i \nabla c_i(t) - \frac{t_i^0}{F} i_e(t) \quad (10)$$

where $D_i$ is the diffusion coefficient, $t_i^0$ the transfer coefficient (only for the ionic species), $i_e$ the current density in the liquid phase, whereas F is the Faraday constant. The conversion ratio is related to the electrochemical reactions:

$$R_i(t) = \sum_z \frac{\kappa_{i,z}}{F} a_{(k)} J_z(t) \quad (11)$$

where $\kappa_{i,z}$ is the stoichiometric coefficient of species "i" in reaction "z" and $a_{(k)}$ is the specific interface surface area in region "k".

The charge conservation in the liquid phase is written as follows:

$$\frac{i_e(t)}{\kappa \epsilon^{\gamma(k)}} = -\nabla \Phi_e(t) - \frac{RT}{F}\left(1 - t_- + \frac{c_e(t)}{c_w}\right)\nabla \ln(f \pm (c_e)c_e(t)) \quad (12)$$

where $c_w$ is the solvent concentration, $\kappa$ is the ionic conductivity of the electrolyte, $\phi_e$ is the potential of the liquid phase and f is a function of $c_e$. The gradient of the current density is related to the transfer currents:

$$\nabla i_e(t) = \begin{cases} a_{(1)}(J_1(t) + J_2(t)) & k = 1 \\ 0 & k = 2 \\ a_{(3)}(J_3(t) + J_4(y)) & k = 3 \end{cases} \quad (13)$$

The previous equations are particularized for the electrolyte, considering that, for the electrical neutrality, the KOH concentration is equal to the OH⁻ ions concentration. Knowing the conversion ratio for the OH⁻ ions calculated by Equation (11) as $$R_e(t) = \frac{\nabla i_e(t)}{F},$$

and considering also Equation (10), Equation (9) for mass conservation of species OH⁻ is written as follows:

$$\epsilon_{(k)}\frac{\partial c_e(t)}{\partial t} = \epsilon_{(k)}^{\gamma(k)} \nabla (D_e \nabla c_e(t)) + \frac{t^0 - 1}{F}\nabla i_e(t) \quad (14)$$

For the species oxygen, the conversion ratio is conventionally evaluated as:

$$R_o(t) = R_{o,eg}(t) + \frac{1}{4F}\begin{cases} a_{(1)}J_2(t) & k = 1 \\ 0 & k = 2 \\ a_{(3)}J_4(t) & k = 3 \end{cases} \quad (15)$$

and Equation (9) becomes:

$$\epsilon_{(k)}\frac{\partial c_o(t)}{\partial t} = \epsilon_{(k)}^{\gamma(k)} \nabla (D_o \nabla c_o(t)) + R_o(t) \quad (16)$$

Equations (12)-(14), (16) constitute a system of four equations with four variables $c_e$, $c_o$, $\epsilon_o$ and $i_e$. The equations are partial differential equations in domain x, as illustrated in FIG. 1.

Solution of this system requires suitable boundary conditions. The boundary conditions for the two species OH⁻ and oxygen are determined by the continuity at the interfaces between the electrodes and the separator, and by the zero-flow condition at the ends of the cell (current collectors). At the collectors, the current in the liquid phase is also zero, because the total current of cell I only passes through the solid phase. To sum up:

$$\nabla c_e(t)=0, \nabla c_o(t)=0, \nabla \Box e(t)=0, i_e=0, x=\{0,L\} \quad (17)$$

and $i_e(t)=I(t)/A_{(k)}$ at $x=I_1$ and $x=I_2$, if $A_{(k)}$ is the geometric surface of region "k".

The equation that substitutes Equation (12) for the solid phase is:

$$i_s(t)=-\sigma_{(k)}(1-\epsilon_{(k)})\nabla \phi_s(t) \quad (18)$$

where $i_s$ is the current density in the solid phase, which is also related to the current by a global charge balance on cell $i_s(t)+i_e(t)=I(t)$, $\sigma_{(k)}$ is the conductivity in region "k" and $\phi_s$ is the potential in the solid phase.

Material Balance

The conservation of mass is coupled according to FIG. 2 with the current density terms resulting from Equations (4)-(7). For the conservation of mass in the solid phase, several approaches have been presented in the prior art. The pseudo-two-dimensional approach considers the solid phase as a macroparticle of spherical or cylindrical geometry, immersed in the electrolyte. The conservation of the protons (which represent nickel) or of the atomic hydrogen (which represents the metal hydride) is written as follows:

$$\frac{\partial c_j(t)}{\partial t} = D_h \nabla_*^2 c_j(t) \tag{19}$$

where $D_h$ is the hydrogen diffusion coefficient. At the interface with the electrolyte, which corresponds to a radius r=R, the material balance is written:

$$-D_h \nabla * c_j(t)|_{r=R} = \frac{J_j(t)}{F} \tag{20}$$

where subscript j is assigned both to nickel, with current density $J_1$, and to the metal hydride, with current density $J_3$.

The method of the invention distinguishes between local concentration c(x,t) and interface concentration in the reference model. The interface concentrations $c_m$ and $c_n$ are used instead of the mean concentrations in Butler-Volmer's equations (4) and (6). The interface concentrations are calculated by the following approximation that replaces Equation (20):

$$\bar{c}_n(t) = c_n(t) - \frac{l_{se} J_1(t)}{FD_{(1)}} \tag{20'}$$

where $I_{se}$ is an interface length and $D_{(1)}$ the diffusivity coefficient of the species.

For the gas phase, a variable $c_g(t)$ representing the oxygen concentration is added. Its variation is written as follows:

$$\frac{\partial c_g(t)}{\partial t} = -\frac{1}{V_g} \int_V R_{o,eg} dV \tag{20a}$$

where V is the volume of the liquid phase, where oxygen is generated, and $R_{o,eg}$ is for example calculated for each zone "k" by:

$$R_{o,eg(k)}(t) = K(\bar{c}_o(t) - c_{o(k)}(t)) \tag{20b}$$

where K is an interfacial mass transport coefficient. The interfacial concentration is:

$$\bar{c}_o(t) = H' \cdot c_g(t) = H \cdot p_o(t) \tag{20c}$$

where H is Henry's constant and H'=RTH.

Thermal Balance

The temperature of the cell can be calculated as an output of the energy balance, according to FIG. 2. On the one hand, the internal heat flux $\phi_{gen}$ generated by the cell activity is given by:

$$\varphi_{gen}(t) = \sum_z J_z(t) \left( U_{eq,ref,z}(t) - T(t) \frac{dU_{eq,ref,z}(t)}{dT} \right) A_{(z)} - V(t)I(t) \tag{20d}$$

where term ($U_{eq,ref,z}$−V) can be associated with the irreversible losses for each electrochemical reaction z, whereas the reversible generation term T $dU_{eq,ref,z}$/dT is directly related to the entropy variations due to the electrochemical reactions. On the other hand, the flux transferred to the ambient at temperature $T_a$, $\phi_{tra}$ is given by Fourier's law:

$$\phi_{tra}(t) = hA_{cell}(T(t) - T_a) \tag{20e}$$

where h is a thermal transfer coefficient associated with the convection and radiation phenomena, and $A_{cell}$ is the surface area of the cell. The net thermal flux through the battery, $\phi$, can be readily calculated as the difference between the internal and external fluxes, i.e. $\phi = \phi_{gen} - \phi_{tra}$. The amount of heat stored in the battery, obtained by integration of the heat flux in time, allows calculation of the temperature of the battery according to the relations:

$$M_{cell} C_p \frac{dT(t)}{dt} = \varphi_{gen}(t) - \varphi_{tra}(t) \tag{20f}$$

where $C_p$ is the specific thermal capacity of the cell and $M_{cell}$ the mass thereof.

Electrical Representation of the Charge Accumulation at the Electrodes in the Reference Model By taking into account the accumulation of the charges at the electrodes, the method of the invention extends the validity domain of Equations (4) and (6) to non-stationary cases, where capacitive effects at the solid-liquid interfaces are significant such as, for example, the "double layer effect". Equation (4) becomes:

$$J_1 = f(\eta_1, c_i) + C_{(1)} \frac{d\eta_1}{dt} \tag{4a}$$

where $C_{(1)}$ is the double layer capacity of electrode 1 (nickel for example). Function f represents the right-hand term of Equation (4).

Similarly, Equation (6) becomes:

$$J_3 = g(\eta_3, c_i) + C_{(3)} \frac{d\eta_3}{dt} \tag{6a}$$

where $C_{(3)}$ is the double layer capacity of electrode 3 (MH for example). Function g represents the right-hand term of Equation (6).

Development of a Reduced Model

The system of equations described above comes in the form of a partial differential system. The constraints imposed by the computing capacities normally available onboard a vehicle do not allow solution of such system in real time. The method used by the invention therefore provides derivation of a model of reduced order, but still based on Equations (1)-(20).

To derive this model, it must be assumed that the concentrations of the species and the other variables are homogeneous in each one of the four regions of the battery cell (zero-dimensional homogenous approximation). For the concentration of the electrolyte, it is written as follows:

$$c_e(t) = \frac{V_{(1)}}{V} c_{(1)} + \frac{V_{(2)}}{V} c_{(2)} + \frac{V_{(3)}}{V} c_{(3)} \tag{21}$$

where $V_{(k)}$ and $c_{(k)}$ are the volume and the concentration of region "k". The variation ratios of concentrations $c_{(k)}$ are given by the following equations:

$$\epsilon_e \frac{dc_{(1)}}{dt} = \frac{N_0 - N_1}{l_{(1)}} + \frac{a_{(1)}}{F}(J_1 + J_2), \quad (22)$$

$$\epsilon_e \frac{dc_{(2)}}{dt} = \frac{N_{1s} - N_{2s}}{l_{(2)}},$$

$$\epsilon_e \frac{dc_{(3)}}{dt} = \frac{N_2 - N_3}{l_{(3)}} + \frac{a_{(3)}}{F}(J_3 + J_4),$$

wherein all the variables have been made explicit except for thicknesses $l_{(k)}$ of the three regions and the material flows at the interfaces between the adjoining regions $N_I$, I=0, ... 3. The latter are written from Equation (10) and boundary conditions (17):

$$N_0 = 0, \quad (23)$$

$$N_1 = -\frac{It^2}{FA_{(1)}},$$

$$N_{1s} = N_{2s} = \frac{I}{A_{(2)}},$$

$$N_2 = -\frac{It^2}{FA_{(3)}},$$

$$N_3 = 0.$$

Consequently, Equation (21) is written as follows:

$$\epsilon_e \frac{dc_e}{dt} = \frac{1}{V}\left[\begin{array}{c}\frac{l_{(1)}A_{(1)}a_{(1)}}{F}(J_1+J_2)+\\ \frac{It^2}{F}+\frac{l_{(3)}A_{(3)}a_{(3)}}{F}(J_3+J_4)-\frac{It^2}{F}\end{array}\right]. \quad (24)$$

but, by taking account of Equation (13), Equation (24) is visibly equivalent to:

$$\varepsilon_e \frac{dc_e}{dt} = 0 \quad (24a)$$

Therefore, the concentration of the electrolyte, in the so-called zero-dimensional (0-d) homogeneous approximation, is a constant.

The conservation of the solid species representative of the MH and nickel electrodes is written in the 0-d method from Equations (19)-(20) by disregarding diffusion:

$$\frac{dc_m}{dt} = -\frac{2}{r}\frac{J_3}{F} \quad (25)$$

$$\frac{dc_n}{dt} = -\frac{1}{y_{(1)}}\frac{J_1}{F} \quad (26)$$

where r is the radius of the macroparticle representing the metal hydride, and $y_{(1)}$ the thickness of the active substrate that surrounds the cylindrical macroparticle representing nickel.

The method used in the invention distinguishes between the mean concentration of the region c(t) and the interfacial concentration in the reduced model. Interfacial concentrations $c_m$ and $c_n$ are used instead of the mean concentrations in Butler-Volmer's equations (4) and (6). The interface concentrations are calculated, as in the reference model, by the following approximation that replaces Equation (20):

$$\overline{c}_n(t) = c_n(t) - \frac{l_{se}J_1(t)}{FD_{(1)}} \quad (20')$$

where $L_{se}$ is an interface length and $D_{(1)}$ the diffusivity coefficient of the species.

The oxygen concentration in the gas phase is written as follows using Equations (19a)-(19c) and assuming that the concentration in the liquid phase is always in quasistatic equilibrium with its interface value:

$$\frac{d}{dt}p_o(t) = -\frac{R \cdot \vartheta_b}{V_g} \cdot \frac{A_{(1)}l_{(1)}a_{(1)}J_2(t)+}{F}, \quad (27)$$

$$c_{o(k)}(t) = \overline{c}_o(t) + \frac{1}{4FK_{tran}}\begin{cases}a_{(1)}J_2(t) & k=1\\ 0 & k=2\\ a_{(3)}J_4(t) & k=3,\end{cases} \quad (27a)$$

which is an implicit algebraic equation to be solved iteratively or with other known methods (relaxation, etc.). In known 0-d methods, the dependence (27a) is always disregarded, and the Butler-Volmer equations (4)-(7) are calculated as a function of $\overline{C}_o$ and thus of the pressure directly.

For the conservation of the charge, Equations (12)-(13) give, in the 0-d approximation:

$$\frac{a_{(1)}l_{(1)}(J_1+J_2) + a_{(3)}l_{(3)}(J_3+J_4)}{\kappa} = 0 \quad (28)$$

Strictly speaking, this equation is valid only under stationary conditions, whereas it is commonly used in the prior art under non-stationary conditions.

Electric Representation of the Accumulation of the Charges at the Electrodes

By taking into account the accumulation of the charges at the electrodes, the method used by the invention extends the validity domain of Equation (28) to the non-stationary cases, where capacitive effects at the solid-liquid interfaces are significant, such as for example the "double layer effect". Equation (28) thus divides into two equations, each one valid for one of the electrodes:

$$C_{dl}\frac{d\Delta\Phi_{pos}(t)}{dt} = \frac{I(t)}{l_{(1)}a_{(1)}A_{(1)}} - (J_1(t) + J_2(t)) \quad (29)$$

$$C_{dl}\frac{d\Delta\Phi_{neg}(t)}{dt} = -\frac{I(t)}{l_{(2)}a_{(2)}A_{(2)}} - (J_3(t) + J_4(t))$$

where $C_{dl}$ is the double layer capacity, whose value can change between the two electrodes.

The 0-d model is complemented by a global balance of the electric potential on the cell:

$$V(t) = \Delta\Phi_{pos}(t) - \Delta\Phi_{neg}(t) + R_{int}I(t) \quad (30)$$

where V is the voltage at the cell terminals and $R_{int}$ is the internal resistance of the cell, resulting from the conductivities of the solid and liquid phases.

To sum up, the reduced model of the method used in the invention comprises Equations (4)-(8), (25)-(27), (29)-(30), that is a total of 15 equations for the 15 variables $J_1, \ldots, J_4$, $\eta_1, \ldots, \eta_4$, $c_m$, $c_n$, $p_o$, $\Delta\phi_{pos}$, $\Delta\phi_{neg}$, V, T.

The other quantities appearing in the equations that constitute the method are dealt with as parameters to be calibrated. A special formulation is assigned to parameter $U_{eq,ref,1}$ appearing in the first relation of Equation (8). This value is known in the prior art to be potentially different between the discharge and charge cases of the cell. For example, in the case of Ni-MH batteries, experience shows a hysteresis effect between charge and discharge. This effect is advantageously taken into account in the method used by the invention, with the following equations:

$$\frac{dU_{eq,ref,1}}{dt} = (U_{eq,ref,1,\infty} - U_{eq,ref,1}) \cdot k(I) \cdot |I| \quad (31)$$

$$k(I) = \begin{cases} k_c, & I > 0 \\ k_d, & I < 0 \end{cases}$$

$$U_{eq,ref,1,\infty} = \begin{cases} U_{eq,ref,1,c}, & I > 0 \\ U_{eq,ref,1,d}, & I < 0 \end{cases}$$

Estimation of the SoC According to the Invention

Definition of the State of Charge According to the Invention

The state of charge of the cell in the method used by the invention, q(t) is given by the concentration of one of the reactive species, in particular by $c_n$ in the example of a Ni-MH type battery:

$$q(t) = -\frac{c_{n,max} - c_n}{c_{n,max}}; \quad (32)$$

This calculation is markedly distinguished from the calculation known in the prior art, referred to as "Coulomb counting", which gives:

$$\frac{dq(t)}{dt} = \frac{I(t)}{Q_{max}} \quad (32a)$$

and leads to the various results illustrated in FIG. 3. The relation between $c_{n,max}$ and $Q_{max}$ is given by:

$$Q_{max} = F c_{n,max} A_{(1)} l_{(1)} a_{(1)} y_{(1)} \quad (33)$$

The estimation of q is thus based on the estimation of $c_n$, whereas this variable is not directly measurable from a battery, in particular on board a vehicle.

Presentation of the Recursive Filter

A diagram in FIG. 4 of the method advantageously uses a recursive filter for estimating the state of the dynamic system from the available measurements is provided. Notable characteristics of this estimation problem are the fact that the measurements are affected by noise and that the modelled system according to the invention is highly non-linear. A recursive filter preferably used in the method is the extended Kalman filter which is known.

According to the model of the method, the state vector of the electrochemical battery cell (FIG. 4) is written: $x = \{c_n, c_m, p_o, \Delta\phi_{pos}, \Delta\phi_{neg}, T\}$, where the first component is related to the state of charge to be estimated by Equation (32). The measurements available are the voltage at the cell terminals and the temperature of the battery, which represent output y of the model, and current I at the terminals, which represents input u of the model. According to the known recursive filter method, the equations of the model are reorganized into:

$$\dot{x} = f(x, u) \quad (34)$$

$$y = h(x, u)$$

SoC Estimation Algorithm

The method then provides a stage (M in FIG. 5) where the model gives the vector of variations f (F in FIG. 5) and the output y (Ye in FIG. 5) is calculated according to Equation (34). These two variables are then processed by a second stage (Est in FIG. 5) that reconstructs state Xe from F, Ye, and the measurement of Y. The estimation algorithm thus uses the output of a third stage (FNL in FIG. 5) that provides variable L as a function of the reconstructed state, the characteristics of the electrochemical system (depending on the model of the method) and the characteristics of the noise that affects the measurements. Stage FNL can be carried out with a known method, such as the extended Kalman filter.

The reduced model directly represents the state of charge as a state variable of the model. On the other hand, known methods use models referred to as "equivalent electric circuit models" where the state of charge is not a dynamic variable of the model but an exogenous variable, as a function of which other dynamic or static variables are parametrized. It is understood that an electrochemical battery management system (BMS) using the method according to the invention estimates the non-measurable characteristics of the battery from commonly available measurements will provide at the output more reliable and more precise information.

SoH Estimation According to the Invention

The reduced model according to the invention is based on physical parameters of the system and not on equivalent global parameters such as the RC models known in the prior art. This property facilitates estimation of the aging and therefore of the state of health of the battery.

In fact, the methods used to estimate the state of charge, which are based on state observers, can be extended to involve a slow adaptation of the parameters of the model. This extension is known in the prior art for several different applications. In the case of the invention, the same signals that circulate in FIG. 4 can also be used for this adaptive extension.

The estimated variations of the parameters of the reduced model serve to detect possible macroscopic variations in the behavior of the battery, and therefore alterations in the performances thereof, which is commonly referred to as "aging". Aging recognition and quantification, through the relative variations of the parameters, gives the desired estimation of the state of health.

Other Uses of the Models of the Method

Battery Simulator

The reference model is also useful as a dimensioning help tool for hybrid vehicle traction chains. An example of a hybrid vehicle simulator integrating a battery model is given in FIG. 6. Typically, these applications need no simulation models operating under real-time conditions, even though a certain computation speed is always desirable. The reference model (1-D model) of the method used in the invention can simulate the dynamic behavior of a traction battery more efficiently and reliably than models of equivalent electric circuit type, and it can therefore be used in a battery simulator. In particular, the electrochemical reference model can serve to test "off-line" the efficiency of the on-line estimator (that uses the reduced 0-d model according to the invention) and to calibrate the parameters thereof, by adapting them to the specific battery under examination.

The reference model as well as the reduced model of the method used in the invention can calculate the variations over time of all the internal electrochemical variables of the battery, and in particular of the state of charge. Since the input of the models is the current at the battery terminals, the simulated cases depend on the selection of the latter variable. For example, a controlled charge or discharge can be represented at constant current, or variable current depending on the profile fixed, or variable current depending on the voltage. The latter case is representative of the battery draw conditions in a vehicle, where the current imposed on the battery depends on the voltage, according to the characteristics of the associated electric components (power electronics, electric motor (s), etc.). Typical results for the battery simulator using the models according to the invention are shown in FIG. 7.

Impedance Spectroscopy Simulator

The models of the estimation method according to the invention (reference model and reduced model) also allow reproduction of experimental impedance spectroscopy tests in order to predict the relations between these measurements and the internal state of charge of the battery. Equation (30) is then modified to account for the inductive effects due to the connections between the cells and with the terminals.

$$V(t) = \Delta\Phi_{pos}(t) - \Delta\Phi_{neg}(t) + R_{int}I(t) + L_{ext}\frac{dI(t)}{dt} \quad (30')$$

This potential of the method used by the invention is illustrated in FIG. 8.

Thermal State Simulator

The presence of the energy balance in the reduced model and in the reference model of the method used by the invention allows simulation of the thermal evolution of the system. Consequently, the method used by the invention can thus serve for dimensioning of the battery and validation of the thermal management systems of which the battery itself must necessarily be equipped. In fact, the thermal fluxes generated and the temperature of the battery are input variables for these systems, whose purpose is to adjust these fluxes and this temperature around allowable values.

The representation of the thermal transients thus allows synthesizing and validation of the control and optimization strategies associated with the thermal management systems. These strategies can thus benefit from the presence of a reduced model during their on-line use, so as to have estimations of certain variables that are not measurable (temperatures at specific points, thermal fluxes, etc.), or that are measurable, but with too long response times of the associated detectors.

The invention claimed is:

1. A system for management of an electrochemical battery comprising:
    a) an input means, coupled to means for measuring at least one parameter representative of at least one physical quantity of the battery, for receiving an input value of the measured at least one parameter representative of at least one physical quantity of the battery;
    b) means for generating at least one output signal of at least one characteristic calculated by estimating an internal state of the electrochemical battery including establishing a reference model for calculation of variations over time of internal electrochemical variables of the battery and deriving a reduced model of the electrochemical battery from the reference model by replacing a local concentration by a mean concentration of active species in the electrochemical battery and wherein the reference model comprises a mathematical representation of kinetics of electrochemical reactions occurring at interfaces between the electrodes and an electrolyte which account for interface concentrations, an electrical representation of spatial accumulation of charges at the electrodes, a balance of the charges in the electrodes and in the electrolyte, a material balance in the electrodes and the electrolyte of the system distinguishing between an interface concentration and a local concentration for the active species and an energy balance of the system for calculating the temperature of the battery; and
    c) means for providing information on at least one of a physical quantity of the battery, controlling charge/discharge of the battery and cooling of the battery in response to the at least one output signal from the means for generating.

2. A management system as claimed in claim 1, wherein a state of health of the electrochemical battery is recorded as an output signal.

3. A management system as claimed in claim 1, wherein potential of the electrochemical battery is recorded as an output signal.

4. A management system as claimed in claim 2, wherein potential of the electrochemical battery is recorded as an output signal.

5. A management system as claimed in claim 1, wherein a state of charge of the electrochemical battery is recorded as an output signal.

6. A management system as claimed in claim 2, wherein a state of charge of the electrochemical battery is recorded as an output signal.

7. A management system as claimed in claim 3, wherein a state of charge of the electrochemical battery is recorded as an output signal.

8. A management system as claimed in claim 4, wherein a state of charge of the electrochemical battery is recorded as an output signal.

9. A management system as claimed in claim 1, wherein a temperature of the electrochemical battery is recorded as an output signal.

10. A management system as claimed in claim 2, wherein a temperature of the electrochemical battery is recorded as an output signal.

11. A management system as claimed in claim 3, wherein a temperature of the electrochemical battery is recorded as an output signal.

12. A management system as claimed in claim 4, wherein a temperature of the electrochemical battery is recorded as an output signal.

13. A management system as claimed in claim 5, wherein a temperature of the electrochemical battery is recorded as an output signal.

14. A management system as claimed in claim 6, wherein a temperature of the electrochemical battery is recorded as an output signal.

15. A management system as claimed in claim 7, wherein a temperature of the electrochemical battery is recorded as an output signal.

16. A management system as claimed in claim 8, wherein a temperature of the electrochemical battery is recorded as an output signal.

17. A management system as claimed in claim 1, wherein the means for generating comprises a recursive filter.

18. A management system as claimed in claim 1 comprising means for providing on-board control and energy management of a hybrid vehicle.

19. A management system as claimed in claim 1, comprising a means of simulating a thermal state of the battery.

20. A battery charger/discharger including a system for management of an electrochemical battery, the system comprising:
- a) an input means, coupled to means for measuring at least one parameter representative of at least one physical quantity of the battery, for receiving an input value of the measured at least one parameter representative of at least one physical quantity of the battery;
- b) means for generating at least one output signal of at least one characteristic calculated by estimating an internal state of the electrochemical battery including establishing a reference model for calculation of variations over time of internal electrochemical variables of the battery and deriving a reduced model from the reference model by replacing a local concentration by a mean concentration for active species in the electrochemical battery and wherein the reference model comprises a mathematical representation of kinetics of electrochemical reactions occurring at interfaces between the electrodes and an electrolyte which account for interface concentrations, an electrical representation of spatial accumulation of charges at the electrodes, a balance of the charges in the electrodes and in the electrolyte, a material balance in the electrodes and the electrolyte of the system distinguishing between an interface concentration and a local concentration for active species and an energy balance of the system for calculating a temperature of the battery; and
- c) means for providing information on at least one of a physical quantity of the battery, controlling charge/discharge and cooling of the battery in response to the at least one output signal from the means for generating.

* * * * *